United States Patent
Hurbi et al.

(10) Patent No.: US 10,375,845 B2
(45) Date of Patent: Aug. 6, 2019

(54) DEVICES WITH MOUNTED COMPONENTS

(71) Applicant: Microsoft Technology Licensing, LLC, Redmond, WA (US)

(72) Inventors: Erin Elizabeth Hurbi, San Francisco, CA (US); Michael Nikkhoo, Saratoga, CA (US); Igor Markovsky, San Jose, CA (US); Brian Joseph Toleno, Cupertino, CA (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 165 days.

(21) Appl. No.: 15/400,255

(22) Filed: Jan. 6, 2017

(65) Prior Publication Data
US 2018/0199455 A1 Jul. 12, 2018

(51) Int. Cl.
- *B32B 3/00* (2006.01)
- *H05K 5/02* (2006.01)
- *G06F 1/16* (2006.01)
- *H05K 7/14* (2006.01)
- *G02B 27/22* (2018.01)

(52) U.S. Cl.
CPC ....... *H05K 5/0247* (2013.01); *G02B 27/2228* (2013.01); *G06F 1/163* (2013.01); *G06F 1/1656* (2013.01); *G06F 1/1658* (2013.01); *H05K 7/14* (2013.01)

(58) Field of Classification Search
CPC .... H05K 5/0247; H05K 7/14; G02B 27/2228; G06F 1/163; G06F 1/1656; G06F 1/1658
See application file for complete search history.

(56) References Cited

U.S. PATENT DOCUMENTS 9,414,530 B1 8/2016 Howard et al.
2015/0237757 A1 8/2015 Lor et al.

FOREIGN PATENT DOCUMENTS

WO 2016118457 A1 7/2016

OTHER PUBLICATIONS

"International Search Report and Written Opinion Issued in PCT Application No. PCT/US2017/068844", dated Apr. 10, 2018, 13 Pages.

*Primary Examiner* — Elizabeth E Mulvaney
(74) *Attorney, Agent, or Firm* — Alleman Hall Creasman & Tuttle LLP

(57) ABSTRACT

Devices with components mounted to a surface interior often encounter problems with generated heat, which is difficult to dissipate from a tightly packed and sealed device interior. Excessive heat may also distort the surface substrate material, which may become brittle from accumulated thermal stress and/or warp in a manner that displaces the position and/or orientation of the components. Presented herein are device manufacturing techniques in view of temperature considerations. Devices may comprise a device housing of a housing material that exhibits a substantially isotropic coefficient of thermal expansion (CTE) and/or thermal conductivity in various dimensions. Devices may also comprise a housing mount for a component cluster that is mountable on the interior surface of the device housing, with electrically conductive traces integrated with the device housing that conductively interconnect the housing mount with the component cluster, optionally generated via laser-activation of a conductive additives or deposition of conductive material.

20 Claims, 5 Drawing Sheets

DEVICES WITH MOUNTED COMPONENTS

BACKGROUND

Within the field of wearable devices, many scenarios involve devices with a set of integrated components, such as a helmet or eyewear featuring a display, a processor, an inertial measurement unit, and a battery. The components are often individually mounted to an interior surface of the device, and are interconnected with wires or flex circuits to enable the transfer of power and data among the components. The positions and/or orientations of the components are often carefully selected to promote the functionality of the devices; e.g., a positioning component may be affixed to a location that determines the orientation of the device, but may only be accurate if the actual position and orientation of the mounted positioning component match an expected position and orientation. In such cases, the relative position of the components to one another may be significant as well; e.g., a helmet device may feature two individual displays are positioned to present a stereoscopic view to each eye of the user, where even a small divergence in the positions and/or orientation of the displays relative to one another may disrupt the stereoscopic presentation.

In many such devices, the operation of the components produces significant amounts of heat, which may deform the substrate material of the device and damage the components. The generation of heat may be exacerbated by the proximity of the components to one another, as components are often packed tightly together within the interior of a device. Additionally, conveying heat away from the components may be limited and/or may be contrary to other design considerations. For example, techniques for venting the interior of the device conflict with sealing the housing to provide an airtight and water-resistant device, while material selection to promote heat dissipation may conflict with material selection to provide durability, shock and scratch resistance, transparency, and/or capacitive touch sensitivity for a surface of the device with an integrated display. These and other considerations may make it difficult to design and manufacture devices with integrated components that are also capable of managing the heat produced by the components integrated thereupon.

SUMMARY

This Summary is provided to introduce a selection of concepts in a simplified form that are further described below in the Detailed Description. This Summary is not intended to identify key factors or essential features of the claimed subject matter, nor is it intended to be used to limit the scope of the claimed subject matter.

Within such scenarios, a variety of techniques may be utilized to design the device in a manner that promotes the management of heat generated by the components; that facilitates the dissipation of heat and the stabilization of temperature of the components and the device interior; and that maintains the position and orientation of the components over time.

Materials used for the housing bodies of devices exhibit a particular coefficient of thermal expansion (CTE) indicating how the material physically expands under increasing temperature. In the scenarios presented herein, devices are occasionally manufactured with materials that exhibit different coefficients of thermal expansion in different dimensions, such as a first CTE in the surface plan along which the material was fabricated, and a different CTE in a dimension that is orthogonal to the material plane. Differences in CTE may cause the position and/or orientation of components integrated with the surface of the device to shift over time, relative to the mounted surface and/or the other components of the device, particularly through numerous heating and cooling cycles. Additionally, many materials exhibit differences in thermal conductivity along different dimensions, such as greater thermal conductivity orthogonal to the surface of the material than within the plane of the material. These differences may reduce heat dissipation and/or create hot-spots within the device surface that exceed a desired tolerance, and that exacerbate and accelerate the shifting of components and accumulated strain, which may lead to premature failure of the device. The problems may be exacerbated by combinations of materials that exhibit different CTE and/or thermal conductivity along different dimensions.

Such problems with heat management may be reduced by designing the device with a device housing comprising a housing material that exhibits a substantially isotropic coefficient of thermal expansion. For example, aluminum exhibits a substantially similar CTE both in-plane and out-of-plane, as well as substantially similar thermal conductivity in the in-plane and out-of-plane dimensions. These material choices may enable the material housing to maintain the established position and/or orientation of the components through many heating and cooling cycles, and to dissipate heat through the device housing in a manner that reduces temperature variation.

Such problems may also be reduced by integrating components with the surface of the device. As a first example, a set of components to be mounted upon the interior surface of the device may be designed as a device cluster, e.g., a display, processor, and inertial measurement unit (IMU) that are integrated and mounted together to a single mount point on the interior surface of the device. As a second example, if two or more components are mounted on the device at different positions, traces may be manufactured in an integrative manner (e.g., additives of the substrate material may be activated with a laser to create conductive paths or conductive materials deposited directly onto the surface), rather than using wires or flex circuits that increase the types of materials and the number of different elements mounted on the surface of the device.

In some devices, these techniques may also be used together. For example, rather than mounting individual components to a substrate that is then mounted to a bracket upon the interior surface of the device and then interconnecting the components with wires or flex circuits, the component cluster may be designed as a single unit that integrates the components and mounted to the interior surface. The component cluster affixes the positions and/or orientation of the components both relative to one another and to the device surface. Additionally, the cluster mount of the device cluster that couples with a housing mount of the housing may integrate traces, thereby serving to secure the components to the housing surface; to affix the positions and/or orientation of the components; to reduce CTE and/or thermal conductivity variance created by the interfaces of different materials, such as the bracket material and the component substrate; and to transmit data signals and/or power among the components of the component cluster, as well as components embedded elsewhere in the device.

To the accomplishment of the foregoing and related ends, the following description and annexed drawings set forth certain illustrative aspects and implementations. These are indicative of but a few of the various ways in which one or more aspects may be employed. Other aspects, advantages, and novel features of the disclosure will become apparent from the following detailed description when considered in conjunction with the annexed drawings.

DETAILED DESCRIPTION

Figure 1:
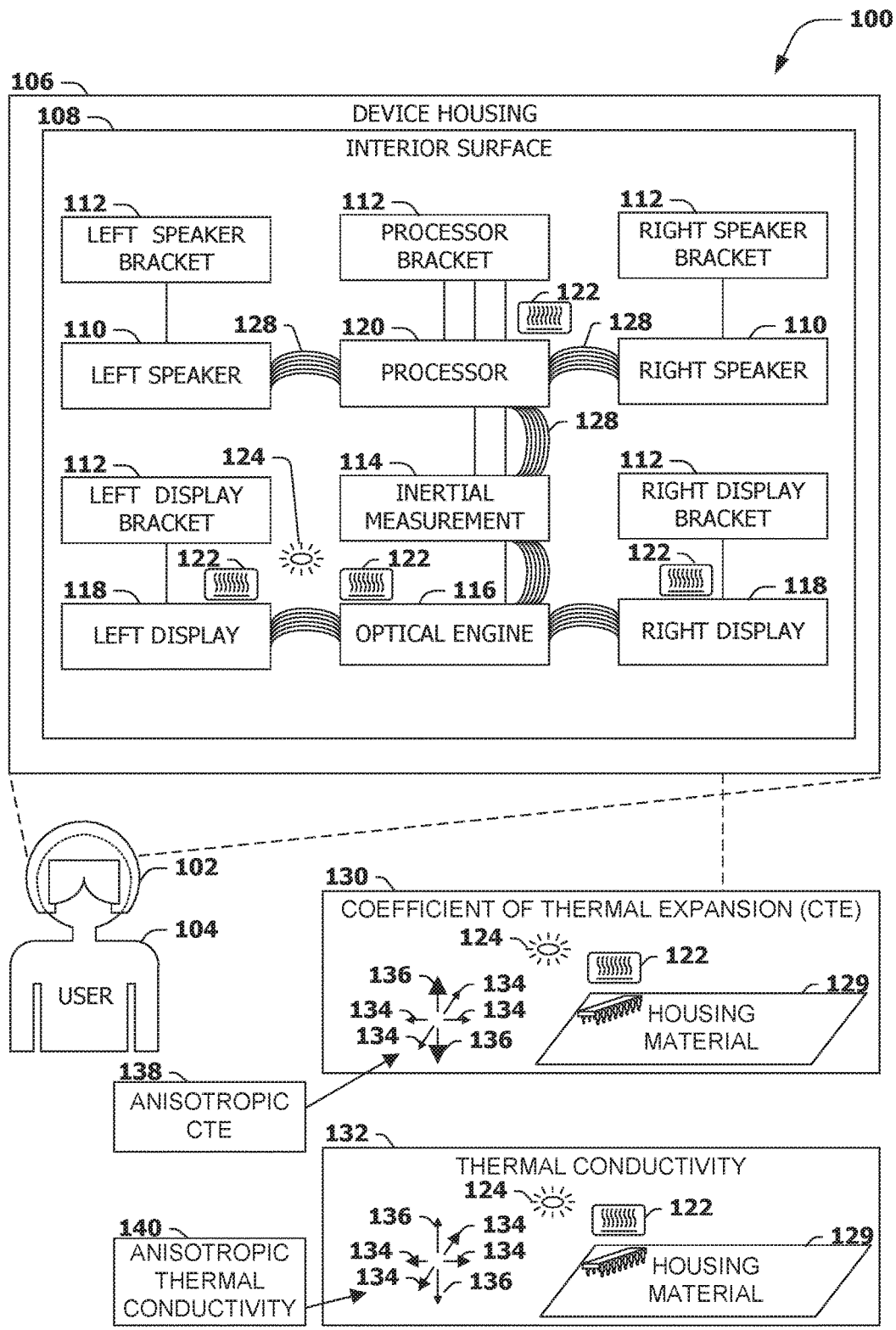
FIG. 1 is an illustration of an example scenario featuring a device with an integrated set of electrical components.

The claimed subject matter is now described with reference to the drawings, wherein like reference numerals are used to refer to like elements throughout. In the following description, for purposes of explanation, numerous specific details are set forth in order to provide a thorough understanding of the claimed subject matter. It may be evident, however, that the claimed subject matter may be practiced without these specific details. In other instances, structures and devices are shown in block diagram form in order to facilitate describing the claimed subject matter.

A. Introduction

FIG. 1 is an illustration of an example scenario 100 featuring a first device 102 with a set of integrated components. In this example scenario 100, the device 102 comprises a wearable unit, such as a helmet worn on the head of a user 104 to present a virtual environment. The device 102 in this example scenario 100 comprises a device housing 106 with an interior surface 108 onto which are mounted set of components, including a left and right speaker 110 that are positioned within the device housing 106 near a left and right ear of the user 104; a left display 118 and a right display 118 that are positioned within the device housing 106 to present a view of the virtual environment to the left eye and right eye of the user 104; an inertial measurement unit 114; an optical engine 116 that drives video output for the left display 118 and right display 118; and a processor 120 that ties together the other components of the device 102. The respective components may be affixed to the device 102 through individual brackets 112, including a processor bracket 112 that attaches a substrate for the processor 120, the inertial measurement unit 114, and the optical engine 116, and individual brackets 112 for the respective speakers 110 and the displays 118. The components are interconnected with wires 128, such as ribbon cables, that are also mounted to the interior surface 108 to provide insulated electrical conductivity of data and power thereamong.

In this example scenario 100, electrical current through some of the components of the device 102 generates heat 122. For example, operation of the left speaker 110 and right speaker 110 may not generate significant amounts of heat 122, but the processor 120 may exhibit high computational throughput that dissipates a significant amount of voltage into heat 122, and the optical engine 116 and displays 118 may generate significant amounts of light as well as heat 122. Some heat 122 produced by the components may conduct through the interior surface 108 of the device housing 106 and radiate into the surrounding environment.

Many factors may cause heat to be retained within the device housing 106. As a first example, conventional heat dissipation techniques may be incompatible with the design of the device 102; e.g., the use of fans to exhaust heat 122 may be incompatible with a design goal of sealing the device housing 106 to provide a water-resistant device 102, and/or of reducing the power requirements or operating noise level of the device 102.

As a second such example, the components may be packaged closely together, such that a significant amount of heat 122 is radiated into a comparatively small portion of the interior surface 108. If heat 122 cannot be dissipated from the locale faster than it is generated, the locale may accumulate heat that produces a hotspot 124 in the interior surface 108.

As a third example, the housing material 129 of the device housing 106 may be chosen based on a variety of design goals, such as reducing the weight of the device 102 (particularly desirable in the case of wearable devices 102); promoting the durability and shock resistance of the device housing 106; and/or reducing the overall cost of the device 102. Some options for housing materials 129 that promote such design goals may also exhibit undesirable properties in the context of heat management. Such properties include, e.g., the coefficient of thermal expansion 130 ("CTE"), which describes the rate of physical expansion and/or contraction of the housing material 129 when subjected to heat 122, and thermal conductivity 132, which describes the rate at which heat 122 propagates through the housing material 129 to be radiated to the environment. A selection of a housing material 129 with a desirable durability may entail a coefficient of thermal expansion 130 and/or thermal conductivity 132 that diminish the performance and/or operating characteristics of the device 102. For example, e.g., housing materials 129 that exhibit a high coefficient of thermal expansion 130 may swell due to heat 122 to such a degree that components are displaced, stretched, and/or dislodged from the interior surface 108; and housing materials 129 exhibiting low thermal conductivity 132 may accumulate heat 122 and hotspots 124 that exceed component tolerances and damage the electrical components.

In addition, some housing materials 129 exhibit properties that are anisotropic, e.g., that vary based on the axis in which the property is measured. As a first example, some specialized thermoplastic materials (e.g. liquid crystal polymers, LCP), when manufactured, exhibit an anisotropic coefficient of thermal expansion 138, wherein heat 122 causes the housing material 129 to expand a modest amount along in-plane axes 134, and a more significant amount in the out-of-plane axis 136. As a second example, such thermoplastic materials may exhibit anisotropic thermal conductivity 140, wherein heat 122 dissipates at one rate along in-plane axes 134, but at a lower rate in the out-of-plane axis 136.

Housing materials 129 that exhibit such anisotropic thermal properties may exhibit inconsistent expansion and/or dissipation of heat 122 along various axes, which may exacerbate the accumulation of hotspots 124. Additionally, surface-mounted components may shift in position and/or orientation with respect to the interior surface 108 and/or with respect to one another, particularly over the course of many thermal cycles. Divergence of the position and/or orientation of such components may be highly disadvantageous; e.g., eyewear with dual displays 118 may enable stereoscopic vision only if the position of the displays 118 relative to the eyes of the user 104 is precisely maintained. Distortion of such positioning and/or orientation may cause focal problems that distort the stereoscopic experience and/or induce undesirable side-effects, such as eyestrain, dizziness, nausea, and headaches. Additionally, asymmetric distortion of the housing material 129 (e.g., brackets 112 affixing the components to the interior surface 108) and/or dissipation of heat 122 may damage the device, e.g., through the accumulation of strain, warping, and other damage; detachment of electrical components; and excessive hotspots 124 that cause damage to the electrical components.

As still another example, the integration of the device 102 as a series of parts—e.g., a bracket that affixes a semiconductor substrate (upon which devices are formed) to the interior surface 108, and wires 128 such as ribbon cables that are separately affixed to the interior surface 108—may increase the number of components within the device housing 106, and/or the variety of such materials. Interfaces between materials of different types may exacerbate the anisotropic properties thereof (e.g., a thermoplastic bracket 112 positioned against a silicon substrate may exhibit different properties than either material alone). Additionally, increasing the number of components within the device housing 106 may increase the complexity, weight, and/or cost of the device 102. Many such disadvantages may arise from devices 102 such as in the example scenario 100 of FIG. 1.

B. Presented Techniques

Figure 2:
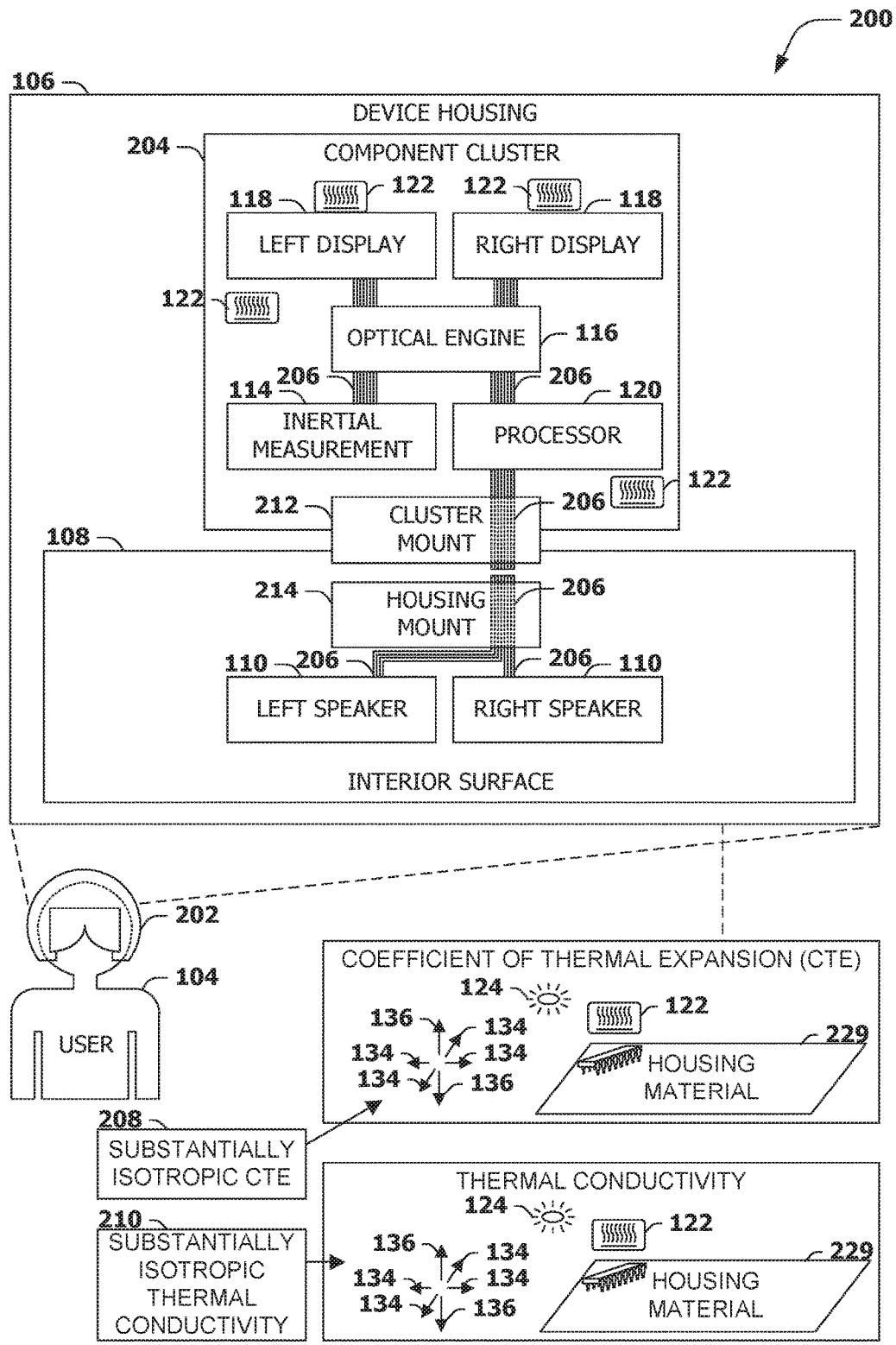
FIG. 2 is an illustration of an example scenario featuring a device with an integrated component cluster in accordance with the techniques presented herein.

FIG. 2 is an illustration of an example scenario 200 featuring an example device 202 organized in accordance with the techniques presented herein. In the example of FIG. 2, the device 202 again comprises a helmet worn on the head of a user 104 and comprises a left and right speaker 110; an inertial measurement unit 114; an optical engine 116 that drives a left display 118 and a right display 118; and a processor 120 that ties together the other electrical components to present a virtual environment to the user 102. The device 202 further comprises a device housing 106 that defines an interior surface 108, to which the components are attached.

Some notable features of the device 202 of the example scenario 200 of FIG. 2 may facilitate the tolerance and dissipation of heat 122 produced by the respective components. As a first such example, the device housing 106 comprises a housing material 229 that exhibits a substantially isotropic coefficient of thermal expansion 208. That is, when exposed to heat 122, the housing material 229 expands at a substantially uniform rate along various axes, including in-plane axes 134 and out-of-plane axes 136, which serves to reduce strain of the thermoplastic molecular structure and resulting damage that may contribute to premature failure of the device 202.

As a second such example, the housing material 229 exhibits a substantially isotropic thermal conductivity 210, such that the housing material 229 radiates and dissipates heat 122 generated by a component at a substantially similar rate along various axes, including in-plane axes 134 and out-of-plane axes 136. Substantially isotropic thermal conductivity 210 promotes a higher retention of heat 122 in the housing material 229 at any particular location near the component, thus reducing hotspots 124 that may similarly damage the housing material 229 and/or components and contribute to premature failure of the device 202.

As a third such example, many of the components of the example device 202 of FIG. 2 are organized as a component cluster 204, such as a single substrate that is mounted on the interior surface 108 through connecting a cluster mount 212 to a housing mount 214. While the left speaker 110 and right speaker 110 are desirably positioned near the sides of the interior surface 108 near the ears of the user 104, the rest of the components are arranged as a unit that is positioned at the front of the helmet near the eyes of the user 104. Organizing the components as a component cluster 204 facilitates the retention of the position and/or orientation of the components with respect to one another by reducing the number of elements and connection points between such components. Additionally, this organization reduces the number of structural elements that are included in the example device 202 (e.g., individual brackets that mount individual components or the substrates thereof, such as in the example scenario 100 of FIG. 1). The reduced number of structural elements may reduce the weight of the example device 202; the physical complexity of the example device 202, such as the number of points of structural failure; and/or the manufacturing complexity, such as the number of individual units that are manufactured and assembled to produce the example device 202.

As a fourth such example, the components in the example device 202 are interconnected via electrically conductive traces 206 embedded in the component cluster 204 and the interior surface 108 of the example device 202. For example, the housing material 229 may comprise a laser-activated conductive additive, such that laser-etching connective paths between the housing mount 214 and the left speaker 110 and the right speaker 110 confers electrical conductivity that enables the transmission of data and power thereamong. The component cluster 204 may also comprise electrically conductive traces, such as a conductive additive that is made electrically conductive through laser-etching, or masking and deposition of electrically conductive material that forms electrically conductive traces, such as a printed circuit board (PCB). Additionally, in the example device 202, the electrically conductive traces 206 of the component cluster 204 extend through the cluster mount 212, and the electrically conductive traces 206 of the housing material 229 extend through the housing mount 214, such that the combination of the cluster mount 212 and the housing mount 214 serves not only to affix the component cluster 204 within the device housing 106, but also to provide electrically conductive connections among the components of the component cluster 204 and the left speaker 110 and right speaker 110 separately disposed on the interior surface 108. Electrically conductive traces 206 may therefore reduce the use of separate individual wires to interconnect the respective components, thereby reducing the number of distinct elements within the example device 202. In this manner, the example device 202 provides numerous features that facilitate the tolerance and dissipation of heat 122 produced by the respective components, in accordance with the techniques presented herein.

C. Technical Effects

Various uses of the techniques presented herein may result in a variety of technical effects.

A first technical effect that may be achieved by the techniques presented herein involves the resulting long-term stability and durability of the housing material 129 of the device housing 106. Heat 122 produced by the components causes the molecular structure of the thermoplastic housing material 129 to expand. Expansion of the housing material 129 in a substantially anisotropic manner, where expansion along a first axis (e.g., an in-plane axis 134) differs from expansion along a second axis (e.g., an out-of-plane axis 136), causes various forms of stress and strain upon the structure. Over the course of many heating and cooling cycles, cumulative damage may cause the housing material 129 to exhibit brittleness, warping, cracking, and/or discoloration. By contrast, housing materials 229 that exhibit substantially isotropic coefficients of thermal expansion 208 may be less susceptible to damage to the molecular structure, and device housings 106 primarily constructed of such housing materials 229 may exhibit greater stability and durability over the course of many heating and cooling cycles. Additionally, housing materials 229 that exhibit substantially isotropic thermal conductivity 210 may radiate in various axes in a substantially equivalent manner, which may further promote substantially equivalent thermal expansion along the various axes 134, 136.

A second technical effect that may be achieved by the techniques presented herein involves the reduction of hotspots 124 in the housing material 129 from heat produced by the components of the device 102. Some housing materials 129 exhibit thermoplasticity (including returning to an initial state after cooling) only within a selected temperature range. When exposed to heat beyond the selected temperature range, the housing material 129 may not return to the initial structure after cooling, and may instead become brittle, warped, cracked, and/or discolored. Such exposure may occur when the heat produced by the components of the device 102 is not isotropically dissipated; e.g., if the housing material 129 exhibits lower thermal conductivity along an out-of-plane axis 136 than along an in-plane axis 134, more heat 122 may be retained deeper within the device housing 106 than at the surface. As presented herein, the use of housing materials 229 that exhibit isotropic thermal conductivity 210 may enable the dissipation of heat 122 in an equivalent manner along various axes, including in-plane axes 134 and out-of-plane axes 136, that reduces the accumulation of hotspots 124 and the resulting consequences for the stability of the device.

A third technical effect that may be achieved by the techniques presented herein involves the positioning and/or orientation of the components mounted to the interior surface 108, both with respect to one another and with respect to the interior surface 108. Distortion of the molecular structure of the housing material 129 may displace the position and/or orientation of the components of the device 102, including the relative position and/or orientation between a first component and a second component. For example, changing the relative position and/or orientation of the left display 118 and the right display 118 may disrupt the stereoscopic presentation of the virtual environment. Even a small displacement of the rotation and/or lateral position of one or both displays 118 may be noticeable and distracting, while a more substantial displacement may induce eyestrain, dizziness, nausea, and headaches. More extensive displacement of the components may result in dislodging or separation from the interior surface 108. The use of the techniques presented herein to tolerate and dissipate heat 122 may reduce the displacement of the components of the device 102, and may therefore extend the long-term durability and functionality of the device 102.

A fourth technical effect that may be achieved by the techniques presented herein involves the reduction of the number and/or variety of elements that are integrated to form the device 102. By arranging several components as a component cluster 204 that is mounted as a unit, and/or by forming components embedded within the interior surface 108 of the device housing 106, a device 102 may reduce the number of structural components involved in the integration of the elements of the device 102. For example, the example device 202 of FIG. 2 provides a cluster mount 212 and housing mount 214 that together mount the entire component cluster 204, while the device 102 in the example scenario 100 of FIG. 1 utilizes five different brackets to mount the respective components at various positions on the interior surface 108. Reducing the number of components may reduce the weight, material expense, and/or manufacturing complexity of the device 102. Additionally, reducing the number of components may extend the durability and functionality of the device 102 (e.g., a device 102 featuring five mounting brackets may exhibit five potential points of failure, where components may shift or become detached, as compared with organizing many components as a unit in a component cluster 204). Similarly, forming electrically conductive traces 206 embedded in the interior surface 108 and the component cluster 204 may reduce the use of wires 128 to provide electrical conductivity among the components, where such wires 128 are often separately attached to the components; are separately and individually mounted to the interior surface 108 (e.g., often utilizing a series of individual brackets to hold the wire in place); and may individually detach to cause a device failure. Such electrically conductive traces 206 also enable the cluster mount 212 and the housing mount 214 to provide electrically conductive interconnectivity to transmit power and/or data as well as a structural mount for the component cluster 204. By contrast, the various brackets in the device 102 of the example scenario 100 of FIG. 1 only provide structural mounting, and electrical interconnectivity is separately achieved by other means such as wires 128.

A fifth technical effect that may be achieved by the techniques presented herein involves a reduction of the variety of materials used in the device 102. For example, the device 102 in the example scenario 100 of FIG. 1 features a device housing 106 (e.g., a housing material 129), a set of brackets 112 (e.g., a second material), one or more substrates (e.g., printed circuit boards (PCBs)), and insulated wires interconnecting these materials. In addition to increasing the cost and complexity of the fabrication process, the inclusion of a variety of materials—particularly in a tightly packed interior of a mobile device—may exacerbate anisotropic thermal expansion and/or anisotropic thermal conductivity. For example, when a housing material 129 is positioned against a different material forming a bracket 112 to hold a substrate of a component that is formed of a third material, each material may exhibit a different coefficient of thermal expansion 130 and/or thermal conductivity 132 along the axis of the interface with the other materials. This further variance may exacerbate the consequences of anisotropic thermal expansion and/or anisotropic thermal conductivity, such as cracking, warping, and the formation of hotspots 124. Reducing the variety of materials, such as in the example device 202 of FIG. 2, may promote consistency of the coefficient of thermal expansion and thermal conductivity of the materials presented in the example device 202. Many such technical effects may arise from the organization of a device 102 in accordance with the techniques presented herein.

D. Example Embodiments

Figure 3:
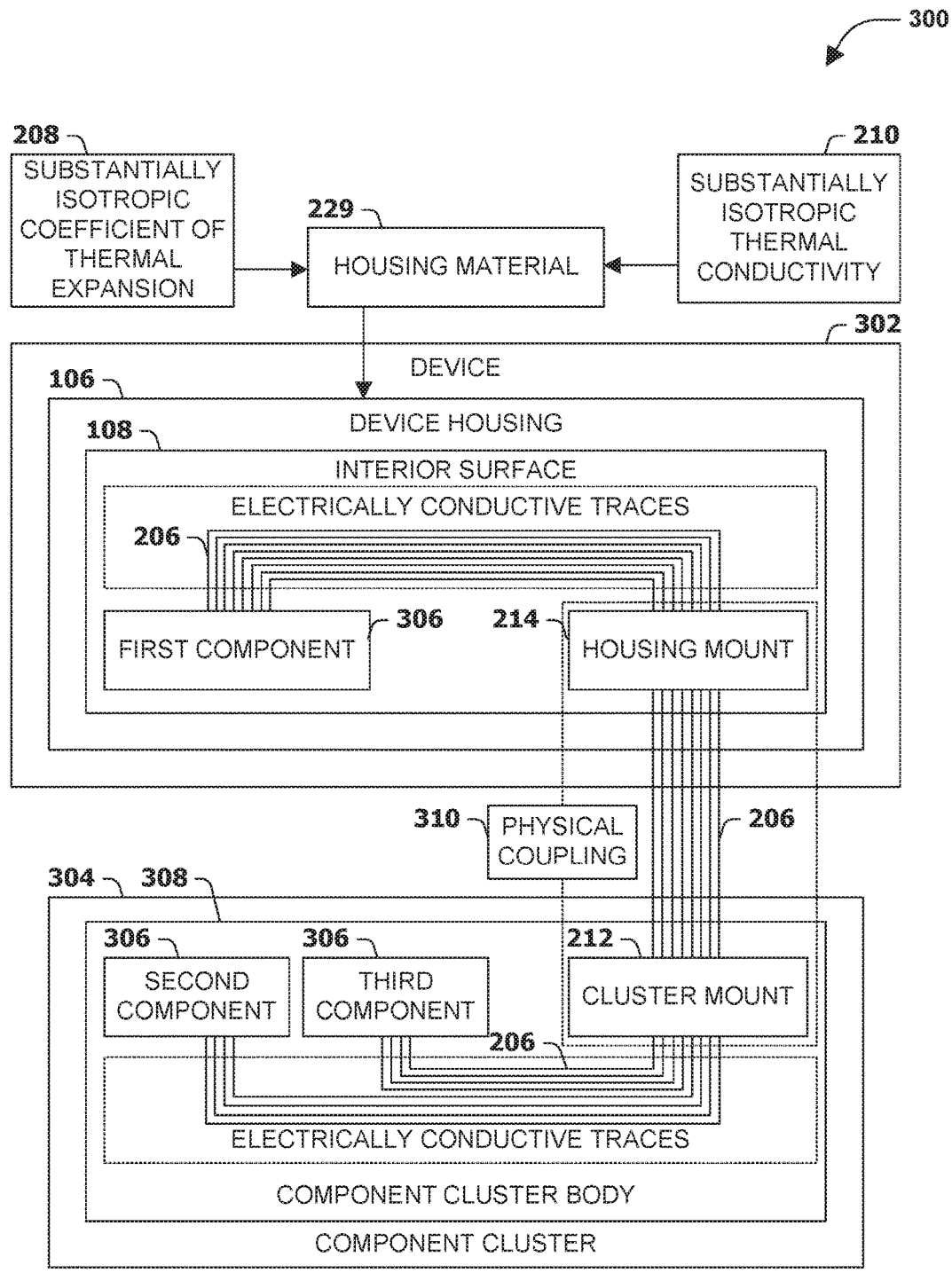
FIG. 3 is a component schematic illustrating two example embodiments of the techniques presented herein.

FIG. 3 is an illustration of an example scenario 300 featuring two example embodiments of the techniques presented herein.

This example scenario 300 presents an example device 302, comprising a device housing 106 that defines an interior surface 108, upon which a first component 306 is mounted. The device housing 106 comprises a housing material 229 that exhibits a substantially isotropic coefficient of thermal expansion 208 (CTE). Optionally, the housing material 229 of the example device 302 also exhibits a substantially isotropic thermal conductivity 210. The device housing 106 of the example device 302 further comprises a housing mount 214 for a component cluster 304, positioned on the interior surface 108 of the device housing 106, that couples with a component cluster 304. The example device 302 further comprises electrically conductive traces 206, which electrically connect the first component 306 with the housing mount 214.

This example scenario 300 also presents an example component cluster 304 that is mountable within a device such as the example device 302. The component cluster 304 comprises a component cluster body 308 upon which is mounted an electrical component set, comprising at least two electrical components 306 (e.g., a second component 306 and a third component 306) mounted on the component cluster body 308. The component cluster 304 further comprises a cluster mount 212, positioned on the component cluster body 308, that couples with the housing mount 214 of a device housing 106 of a device such as the example device 302. The component cluster 304 further comprises electrically conductive traces 206, formed on the component cluster body 308, that conductively connect the at least two electrical components 306 to the cluster mount 212. The physical layout of the example component cluster 304 is selected to establish and maintain the position and/or orientation of the second component 306 relative to the third component 306 (e.g., to provide the left display 118 and the right display 118 at a selected distance from one another, and that orients the displays 118 with respect to one another, to match a typical separation distance and orientation of the eyes of a user 104). Additionally, the physical layout of the example component cluster 304 is also selected such that, when the example component cluster 304 is mounted within the device housing 106, the components 306 provided on the example component cluster 304 are located at desired positions and orientations within the device housing 106, such as positioning the left display 118 and the right display 118 at a desired location with respect to the eyes of a user 104 wearing the device 302.

The example device 302 and the example component cluster 304 are usable together to provide an integrated device in accordance with the techniques presented herein. Connecting the cluster mount 212 of the example component cluster 304 to the housing mount 214 of the example device 302 provides an integrated device 102 that physically mounts the example component cluster 304 to the interior surface 108 of the example device 302, and positions the components 306 of the example component cluster 304 at desired positions and/or orientations on the interior surface 108. Additionally, the combination electrically interconnects the component set of the example component cluster 304 with the first component 306 positioned on the interior surface 108 of the device housing 106, in accordance with the techniques presented herein.

Figure 4:
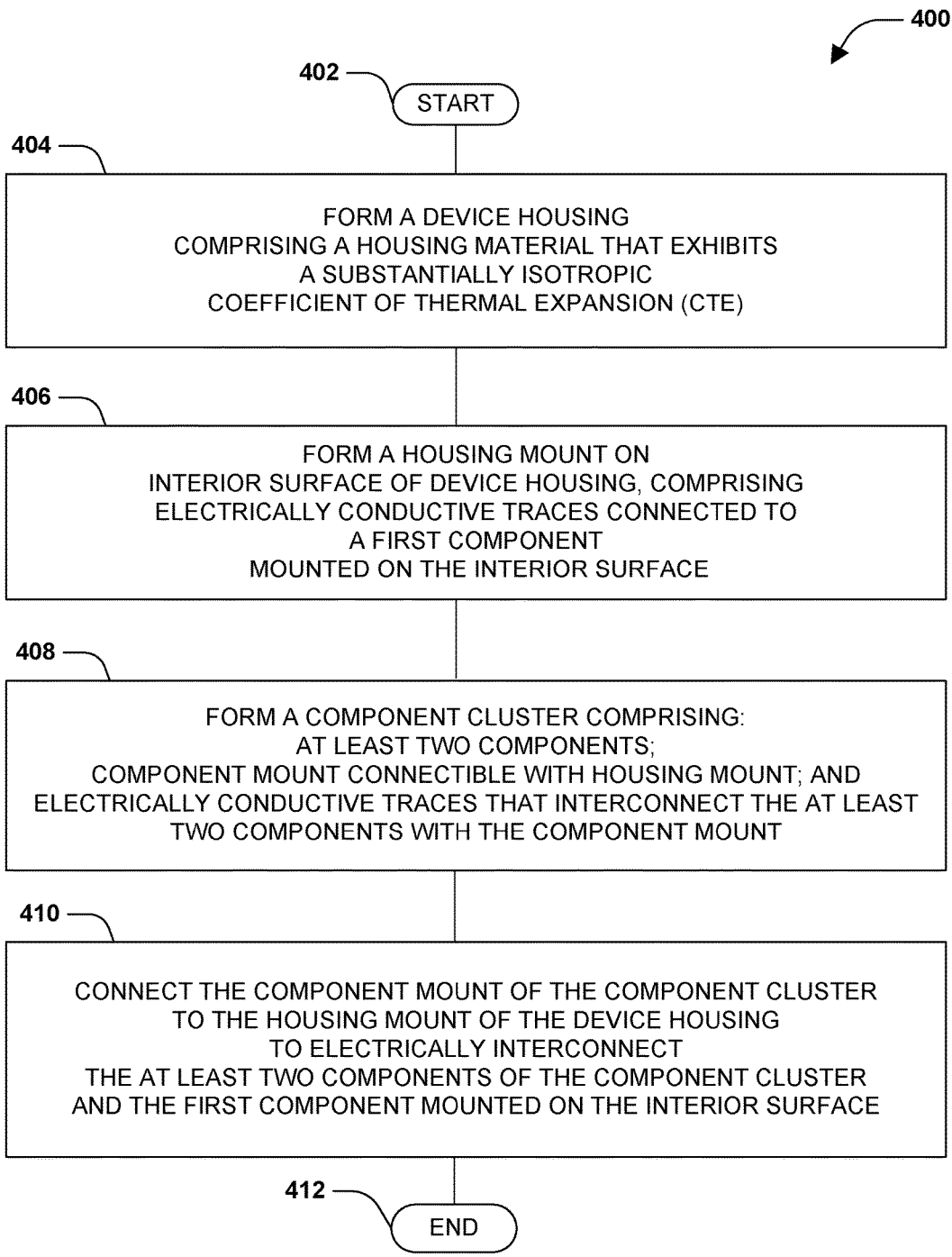
FIG. 4 is an illustration of an example method of forming a device in accordance with the techniques presented herein.

FIG. 4 is an illustration of a third embodiment of the techniques presented herein, illustrated as an example method 400 of forming a device, such as the combination illustrated in the example scenario 300 of FIG. 3.

The example method 400 of FIG. 4 begins at 402 and involves forming 404 a device housing 106 comprising a housing material 229 that exhibits a substantially isotropic coefficient of thermal expansion 208 (CTE). The example method 400 also involves forming 406 a housing mount 214 on an interior surface 108 of the device housing 106, wherein the housing mount 214 comprises electrically conductive traces 206 connected to a first component 306 mounted on the interior surface 108. The example method 400 also involves forming 408 a component cluster 304, comprising: at least two components 306; a cluster mount 212 that is connectible with the housing mount 214; and electrically conductive traces 206 that interconnect the at least two components 306 with the cluster mount 212. The example method 400 also involves connecting 410 the cluster mount 212 of the component cluster 304 to the housing mount 214 of the device housing 106, which both mounts the component cluster 304 to the interior surface 108 of the device 302, and electrically interconnects the at least two components 306 of the component cluster 304 and the first component 306 mounted on the interior surface 108. Having achieved the electrical interconnection of the components 306, the example method 400 achieves the formation of a device 302 in accordance with the techniques presented herein, and so ends at 412.

E. Variations

The techniques discussed herein may be devised with variations in many aspects, and some variations may present additional advantages and/or reduce disadvantages with respect to other variations of these and other techniques. Moreover, some variations may be implemented in combination, and some combinations may feature additional advantages and/or reduced disadvantages through synergistic cooperation. The variations may be incorporated in various embodiments (e.g., the example device 302 of FIG. 3; the example component cluster 304 of FIG. 3; and the example method 400 of FIG. 4) to confer individual and/or synergistic advantages upon such embodiments.

E1. Scenarios

A first aspect that may vary among embodiments of these techniques relates to the scenarios wherein such techniques may be utilized.

As a first variation of this first aspect, the techniques presented herein may be utilized to produce many types of devices with integrated electrical components 306. Such devices include wearable devices, such as helmets, eyeglasses, headphones, headsets, earpieces, wristwatches, armbands, necklaces, bracelets, gloves, and footwear. Such devices also include other types of portable devices, such as tablets, mobile phones, portable media players, and portable game consoles.

As a second variation of this first aspect, the techniques presented herein may be utilized with a variety of components 306 that may facilitate the functionality of the device. For example, a device 302 such as a helmet that mounts on the head of the user 104 may include such components 306 as a speaker; a display; an inertial measurement unit; a processor; a gaze-tracking camera that tracks the gaze of the user 104; an environment-tracking camera that captures an image of the environment of the device 102; a temperature sensor that senses a temperature of the environment of the device 102; a network adapter that facilitates communication of the device 102 with other devices; and a battery. The components 306 may also support other components 306 of the device 102, such as a memory that serves as a cache for a processor, or a sensor coupled with a light-producing display and integrated in the component cluster with the light-producing display. Many such variations may be identified wherein the techniques presented herein may be utilized.

E2. Housing Materials

A second aspect that may vary among embodiments of the techniques presented herein involves the housing material 229 that forms the device housing 106, and optionally other portions of the device 302, such as the component cluster body 308 of the component cluster 304, the cluster mount 212 of the component cluster 304, and/or the housing mount 214 of the device housing 106.

Figure 5:
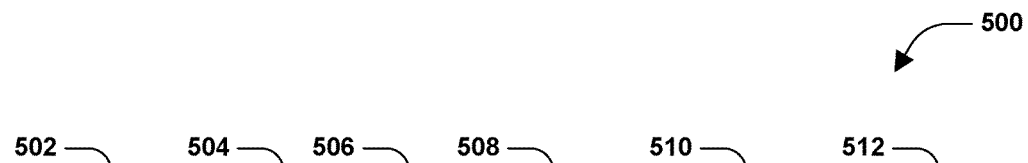
FIG. 5 is a tabular presentation of a set of materials and associated properties that may inform the use of such materials in the techniques presented herein.

As a first variation of this second aspect, FIG. 5 presents a tabular presentation 500 of the physical properties of various materials 502 that may be used as a housing material 229, such as the density 504; in-plane CTE 506 vs. out-of-plane CTE 508; and in-plane thermal conductivity 510 vs. out-of-plane thermal conductivity 512. As this tabular presentation 500 demonstrates, aluminum exhibits a substantially isotropic CTE and thermal conductivity, while Lycra does not. Carbon-fiber reinforced polymers (CFRP) ordinarily exhibit anisotropic CTE and thermal conductivity, but can be constructed to approach isotropic CTE and isotropic thermal conductivity. For instance, a liquid-crystal polymer may comprise oriented carbon fibers that are oriented to provide a substantially isotropic coefficient of thermal expansion along at least two axes. Alternatively, or additionally, a thermally conductive additive may be added to a selected housing material 229 that increases thermal conductivity through the device housing 106 of the device. Some such additives may further exhibit substantially isotropic thermal conductivity along at least two axes.

As a second variation of this second aspect, the consideration of such materials 502 for use as a housing material 229 may also entail some tradeoffs; e.g., aluminum also exhibits a higher density, and therefore a potentially higher weight of the device 302. Some compromises may be made, e.g., by manufacturing portions of the device 302 to which components 306 are mounted using aluminum and/or a processed carbon-fiber reinforced polymer, while other portions of the device 302 that are distant from the components may be manufactured from Lycra or other lightweight materials.

As a third variation of this second aspect, the selection of materials may also facilitate the manufacturing of the device. As a first such example, the housing material 229 of the device housing 106 may ordinarily comprise an electrical insulator, and a laser-activated conductive additive may be added to the housing material 229 during formation. Exposing the housing material 229, including the laser-activated conductive additive, to lasers of certain wavelengths may form a conductive path, which may be formed as an electrically conductive trace 206 that interconnects at least two components 306 of the device 302. As a second such example, the housing material 229 may further comprise a resin that reduces a strain-to-failure measurement of the housing material 229.

As a fourth variation of this second aspect, additional components may be included in the device 302 to facilitate the management of heat 122. For example, a heatsink that conducts heat away from the component cluster through the device housing 106 may be embedded in the device housing 106. Many such variations of housing materials 229, and considerations in the selection thereof, may be utilized in accordance with the techniques presented herein.

E3. Component Organization

A third aspect that may vary among embodiments of the techniques presented herein relates to the physical organization of the components 306 of the device housing 106 and/or the component cluster 304.

As a first such example, one or more housing components 306 mounted to the device housing 106 may be fabricated directly on the device housing 106. For example, at least a portion of the device housing 106 may comprise a silicon substrate, and components 306 such as transistors may be formed directly on the device housing 106. Similarly, one or more components 306 of the component cluster 304 may be fabricated directly on the component cluster 304. For example, at least a portion of the component cluster body 308 may comprise an electrically insulated substrate, such as a silicon substrate, and at least two components 306 such as transistors may be formed directly on the component cluster body 308.

As a second such example (such as shown in the example scenario 300 of FIG. 3), the cluster mount 212 of the component cluster 304 may further comprise electrically conductive traces 206 that are conductively interconnected with the components 306 of the component cluster 304. Additionally, the housing mount 214 of the interior surface 108 of the device 302 may further comprise electrically conductive traces 206 that conductively interconnect the component cluster 304 and a housing component 306 mounted on the interior surface 108 of the device 302, and the electrically conductive traces 206 formed on the device cluster body 308 may further connect with the electrically conductive traces 206 of the housing mount 214 while the cluster mount 212 is coupled with the housing mount 214. The electrically conductive traces 206 of the housing mount 214 may therefore conductively connect to the electrically conductive traces 206 of the cluster mount 212, while the housing mount 214 is coupled with the cluster mount 212, to conductively interconnect the housing component 306 and the component cluster 304.

As a third such example, the cluster mount 212 may comprise a single mount point that couples with a single housing mount 214 of the interior surface 108 of the device 302. That is, the entire component cluster 304, including all of the components 306 mounted thereto, may be affixed to the interior surface 108 of the device housing 106 using a single mount point, which may serve to establish and secure the positions of the components 306, as well as to provide electrical conductivity between the components 306 of the component cluster 304 and any components 306 mounted on the interior surface 108 of the device 302.

As a fourth such example, various structural choices of the device 302 may serve to retain the position and/or orientation of the components 306. As a first such example, a position and/or orientation of a first electrical component 306 may be selected relative to a second position and/or orientation of a second electrical component 306 (e.g., a position of a left display 118 relative to a right display 118), and the device cluster body 308 may further comprise an optical bench that maintains the position and/or orientation of the first electrical component 306 relative to the second electrical component 306. As a second such example, a position and/or orientation of an electrical component 306 may be selected relative to a position and/or orientation relative to the interior surface 108 of the device 302 while the component cluster 304 is mounted to the interior surface 108 of the device 102. The device cluster body 308 may further comprise an optical bench that maintains the position and/or orientation of the electrical component 306 relative to the interior surface 108 of the device 302. In the specific case of a head-mounted device wearable on the head of the user 104, the electrical components 306 may further comprise a left display that presents a left visual to the user 104, and a right display that presents a right visual to the user 104. The optical bench may be mounted to the interior surface 108 at a mount position that maintains the position and orientation of the left display relative to a left eye of the user 104, and maintains the position and orientation of the right display relative to a right eye of the user 104. Many such architectural choices may be included in the design of a device in accordance with the techniques presented herein.

F. Usage of Terms

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

As used in this application, the terms "component," "module," "system", "interface", and the like are generally intended to refer to a computer-related entity, either hardware, a combination of hardware and software, software, or software in execution. One or more components may be localized on one computer and/or distributed between two or more computers.

Furthermore, the claimed subject matter may be implemented as a method, apparatus, or article of manufacture using standard programming and/or engineering techniques to produce software, firmware, hardware, or any combination thereof to control a computer to implement the disclosed subject matter. The term "article of manufacture" as used herein is intended to encompass a computer program accessible from any computer-readable device, carrier, or media. Of course, those skilled in the art will recognize many modifications may be made to this configuration without departing from the scope or spirit of the claimed subject matter.

Various operations of embodiments are provided herein. In one embodiment, one or more of the operations described may constitute computer readable instructions stored on one or more computer readable media, which if executed by a computing device, will cause the computing device to perform the operations described. The order in which some or all of the operations are described should not be construed as to imply that these operations are necessarily order dependent. Alternative ordering will be appreciated by one skilled in the art having the benefit of this description. Further, it will be understood that not all operations are necessarily present in each embodiment provided herein.

Any aspect or design described herein as an "example" is not necessarily to be construed as advantageous over other aspects or designs. Rather, use of the word "example" is intended to present one possible aspect and/or implementation that may pertain to the techniques presented herein. Such examples are not necessary for such techniques or intended to be limiting. Various embodiments of such techniques may include such an example, alone or in combination with other features, and/or may vary and/or omit the illustrated example.

As used in this application, the term "or" is intended to mean an inclusive "or" rather than an exclusive "or". That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. In addition, the articles "a" and "an" as used in this application and the appended claims may generally be construed to mean "one or more" unless specified otherwise or clear from context to be directed to a singular form.

Also, although the disclosure has been shown and described with respect to one or more implementations, equivalent alterations and modifications will occur to others skilled in the art based upon a reading and understanding of this specification and the annexed drawings. The disclosure includes all such modifications and alterations and is limited only by the scope of the following claims. In particular regard to the various functions performed by the above described components (e.g., elements, resources, etc.), the terms used to describe such components are intended to correspond, unless otherwise indicated, to any component which performs the specified function of the described component (e.g., that is functionally equivalent), even though not structurally equivalent to the disclosed structure which performs the function in the herein illustrated example implementations of the disclosure. In addition, while a particular feature of the disclosure may have been disclosed with respect to only one of several implementations, such feature may be combined with one or more other features of the other implementations as may be desired and advantageous for any given or particular application. Furthermore, to the extent that the terms "includes", "having", "has", "with", or variants thereof are used in either the detailed description or the claims, such terms are intended to be inclusive in a manner similar to the term "comprising."

What is claimed is:

1. A device comprising:
    a device housing comprising a housing material exhibiting a substantially isotropic coefficient of thermal expansion;
    a first component mounted on an interior surface of the device housing;
    a housing mount for attaching a component cluster, the housing mount mounted on the interior surface of the device housing;
    a cluster mount coupled to the housing mount to attach the component cluster to the device housing, the component cluster comprising a display; and
    electrically conductive traces formed on the device housing that conductively interconnect the housing mount through the device housing to the display of the component cluster.

2. The device of claim 1, wherein the housing material further comprises a polymer comprising oriented fibers that are oriented to provide the substantially isotropic coefficient of thermal expansion, wherein the substantially isotropic coefficient of thermal expansion is substantially isotropic along at least two axes.

3. The device of claim 1, wherein the device housing further comprises a thermally conductive additive that increases thermal conductivity through the device housing of the device.

4. The device of claim 3, wherein the thermally conductive additive further exhibits substantially isotropic thermal conductivity along at least two axes.

5. The device of claim 1, wherein:
the device housing further comprises a laser-activated conductive additive; and
the electrically conductive traces comprise laser activated traces.

6. The device of claim 1, wherein the electrically conductive traces further comprise conductive material deposited on the interior surface of the device housing.

7. The device of claim 1, wherein:
the cluster mount further comprises electrically conductive traces that are conductively interconnected with the component cluster; and
the electrically conductive traces of the housing mount further conductively connect to the electrically conductive traces of the cluster mount, while the housing mount is coupled with the cluster mount, to conductively interconnect the first component and the component cluster.

8. The device of claim 1, wherein the housing material further comprises a resin that reduces a strain-to-failure measurement of the housing material.

9. The device of claim 1, further comprising a heatsink that conducts heat away from the component cluster through the device housing.

10. A component cluster mountable within a device, the component cluster comprising:
a component cluster body;
a cluster mount positioned on the component cluster body that couples with a housing mount of an interior surface of a device housing of the device;
an electrical component set comprising at least two electrical components mounted on the component cluster body, the at least two electrical components comprising a display; and
electrically conductive traces formed on the component cluster body that conductively connect the at least two electrical components through the cluster mount to another electrical component of the device.

11. The component cluster of claim 10, wherein the cluster mount comprises a single mount point that couples with a single housing mount of the interior surface of the device.

12. The component cluster of claim 10, wherein the at least two electrical components comprise:
a sensor coupled with the display.

13. The component cluster of claim 10, wherein:
the component cluster is mounted within the device, the device comprising a helmet mountable on a head of a user; and
the electrical component set comprises an electrical component selected from:
a gaze-tracking camera;
an environment-tracking camera;
a speaker;
a display;
an inertial measurement unit;
a temperature sensor;
a processor;
a network adapter; and
a battery.

14. The component cluster of claim 10, wherein:
a position of a first electrical component of the electrical component set is selected relative to a position of a second electrical component of the electrical component set; and
the component cluster body further comprises an optical bench that maintains an orientation of the first electrical component relative to the second electrical component.

15. The component cluster of claim 10, wherein:
the component cluster is mounted to the interior surface of the device;
a position of a first electrical component of the electrical component set is selected relative to an orientation relative to the interior surface of the device; and
the component cluster body further comprises an optical bench that maintains an orientation of the first electrical component relative to the interior surface of the device.

16. The component cluster of claim 10, wherein the component cluster is mounted in a device, and wherein:
the housing mount of the interior surface of the device housing further comprises electrically conductive traces that conductively interconnect the component cluster and a component mounted on the device; and
the electrically conductive traces formed on the component cluster body further connect with the electrically conductive traces of the chousing mount when the cluster mount is coupled with the housing mount.

17. The component cluster of claim 10, wherein:
the component cluster is mounted to the interior surface of the device housing,
the device housing comprising a housing material exhibiting a substantially isotropic coefficient of thermal expansion; and
the material of the component cluster body comprises the housing material of the device housing.

18. The component cluster of claim 10, wherein the component cluster body further comprises an electrically insulated substrate upon which the at least two electrical components are formed.

19. A wearable device mountable on a user, the wearable device comprising:
a device housing comprising a housing material exhibiting a substantially isotropic coefficient of thermal expansion and a substantially isotropic thermal conductivity, and defining an interior surface of the device housing;
a component cluster comprising:
an optical bench mounted to the interior surface of the device housing, and
at least two electrical components each mounted to the optical bench with a position and an orientation, wherein the optical bench maintains the position and orientation of each of the at least two electrical components relative to other electrical components and the interior surface; and
electrical traces formed on the component cluster that conductively interconnect the at least two electrical components.

20. The wearable device of claim 19, wherein:
the wearable device further comprises a head-mounted device wearable on the head of the user;
the at least two electrical components comprise:
a left display that presents a left visual to a user, and
a right display that presents a right visual to the user; and
the optical bench is mounted to the interior surface of the device housing at a mount position that maintains a position and an orientation of the left display relative to a left eye of the user, and maintains a position and an orientation of the right display relative to a right eye of the user.

* * * * *